United States Patent
Pan et al.

(10) Patent No.: US 9,100,015 B1
(45) Date of Patent: Aug. 4, 2015

(54) FIND-FIRST-SET BIT CIRCUIT AND METHOD

(71) Applicant: Xilinx, Inc., San Jose, CA (US)

(72) Inventors: Chuan Cheng Pan, San Jose, CA (US); Ashish Gupta, San Jose, CA (US); Siva Prasad Gadey, Bangalore (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/322,384

(22) Filed: Jul. 2, 2014

(51) Int. Cl.
*H03K 19/20* (2006.01)
*H03K 19/21* (2006.01)

(52) U.S. Cl.
CPC ............... *H03K 19/20* (2013.01); *H03K 19/21* (2013.01); *H03K 19/212* (2013.01)

(58) Field of Classification Search
CPC ....... H03K 19/20; H03K 19/02; H03K 19/21; H03K 19/212; H03K 19/0944
USPC ...................... 326/104, 52–55, 112, 119, 121
See application file for complete search history.

(56) References Cited

U.S. PATENT DOCUMENTS

| | | | | |
|---|---|---|---|---|
| 5,880,978 A | * | 3/1999 | Panwar et al. | 708/211 |
| 6,266,379 B1 | * | 7/2001 | Dally | 375/296 |
| 2003/0140072 A1 | * | 7/2003 | Hoskote | 708/1 |
| 2013/0103732 A1 | * | 4/2013 | Asanaka | 708/505 |
| 2013/0262546 A1 | * | 10/2013 | Shinomiya et al. | 708/495 |

* cited by examiner

*Primary Examiner* — Dylan White
(74) *Attorney, Agent, or Firm* — LeRoy D. Maunu

(57) ABSTRACT

Finding the first bit that is set in an n-bit input word includes generating n n-bit patterns from an n-bit input word. If the bit at one bit position of the input word has a logic 1 value, a corresponding pattern has a logic 1 value in a corresponding bit position and in each bit position left of the corresponding bit position, and a logic 0 value in each bit position right of the corresponding bit position. If the bit at the one bit position of the input word has a logic 0 value, the corresponding pattern has a logic 0 value in every bit position. The n patterns are combined into one merged n-bit pattern. An output n-bit pattern is generated from the merged n-bit pattern. The output pattern has a logic 1 value in one bit position that is the same as the rightmost bit position of the input word having a logic 1 value, and a logic 0 value in every other bit position.

20 Claims, 4 Drawing Sheets

US 9,100,015 B1

FIND-FIRST-SET BIT CIRCUIT AND METHOD

TECHNICAL FIELD

The disclosure generally relates to circuits and methods for finding the first bit having a particular logic value in an input word.

BACKGROUND

Find-first-set logic circuits and methods are used in a variety of applications to determine the first valid entry in an input data set. For example, find first-set logic circuits and methods may be used to find the first available identifier of identifiers that are managed out of order, determine an available tag for a transaction, allocate an available entry in a register file, or find the first event in a snapshot of events.

Some implementations determine the first bit having a logic 1 value in an input word. The least significant or rightmost bit that has a logic 1 value may be considered to be the first valid entry. However, current approaches may be problematic, because significant delay may be introduced into the logic path for large entry counts. That is, as the number of bits in the input data word increases, the delay introduced in finding the first set bit may exceed acceptable limits.

It is desirable to provide circuits and/or methods that address this issue.

SUMMARY

A disclosed method of finding a first bit that is set in an n-bit input word includes generating by a first logic circuit, n n-bit patterns in response to the n-bit input word. Each pattern corresponds to one bit position of the n-bit input word. In response to the bit at the one bit position of the input word having a logic 1 value, the corresponding pattern has a logic 1 value in a corresponding bit position of the n-bit pattern, a logic 1 value in each bit position left of the corresponding bit position in the n-bit pattern, and a logic 0 value in each bit position right of the corresponding bit position in the n-bit pattern. In response to the bit at the one bit position of the n-bit input word having a logic 0 value, the corresponding pattern has a logic 0 value in each bit position of the n-bit pattern. A second logic circuit combines the n n-bit patterns into one merged n-bit pattern, and a third logic circuit generates an output n-bit pattern in response to the merged n-bit pattern. The output n-bit pattern has a logic 1 value in one bit position and a logic 0 value in every other bit position. The one bit position having the logic 1 value is equal to a rightmost bit position of the input word having a logic 1 value.

One disclosed find-first-set circuit includes a translator circuit having an input port coupled to receive an n-bit input word. The translator circuit is configured to generate n n-bit patterns. Each pattern corresponds to one bit position of the n-bit input word. In response to the one bit position of the input word having a logic 1 value, the translator is configured to generate the corresponding pattern having a logic 1 value in a corresponding bit position of the n-bit pattern, a logic 1 value in each bit position left of the corresponding bit position in the n-bit pattern, and a logic 0 value in each bit position right of the corresponding bit position in the n-bit pattern. In response to the one bit position of the input word having a logic 0 value, the translator is configured to generate the corresponding pattern having a logic 0 value in each bit position of the n-bit pattern. A merge circuit is coupled to receive the n n-bit patterns and is configured to combine the n n-bit patterns into one merged n-bit pattern. An indicator circuit is coupled to receive the merged n-bit pattern and is configured to generate an output n-bit pattern having a logic 1 value in one bit position and a logic 0 value in every other bit position. The one bit position having the logic 1 value is equal to a rightmost bit position of the input word having a logic 1 value.

Another find-first-set circuit includes a plurality of first detector circuits. Each first detector circuit is configured to receive respective first n-bit input words, and each respective first n-bit input word is a portion of an m-bit input word. Each first detector circuit is further configured to generate a respective first output n-bit pattern having a logic 1 value in one bit position and a logic 0 value in every other bit position. The one bit position having a logic 1 value is equal to a rightmost bit position of the respective first n-bit input word having a logic 1 value. A reduction circuit is coupled to receive the respective first output n-bit patterns. The reduction circuit is configured to reduce each respective first output n-bit pattern to a respective output bit having a logic value that indicates whether or not any bit of the respective first output n-bit pattern has a logic value 1. A second detector circuit is coupled to receive the respective output bits from the reduction circuit as an m/n-bit input word. The second detector circuit is configured to generate an output m/n-bit pattern having a logic 1 value in one bit position and a logic 0 value in every other bit position. The one bit position having a logic 1 value is equal to a rightmost bit position of the m/n-bit input word having a logic 1 value. A mask circuit is coupled to receive the respective first output n-bit patterns and the output m/n-bit pattern. The mask circuit is configured to generate an output m-bit pattern having a logic 1 value in one bit position and a logic 0 value in every other bit position. The one bit position having the logic 1 value is equal to a rightmost bit position of the m-bit input word having a logic 1 value.

Other features will be recognized from consideration of the Detailed Description and Claims, which follow.

BRIEF DESCRIPTION OF THE DRAWINGS

Various aspects and features of the circuits and methods will become apparent upon review of the following detailed description and upon reference to the drawings, in which.

DETAILED DESCRIPTION

Figure 1:
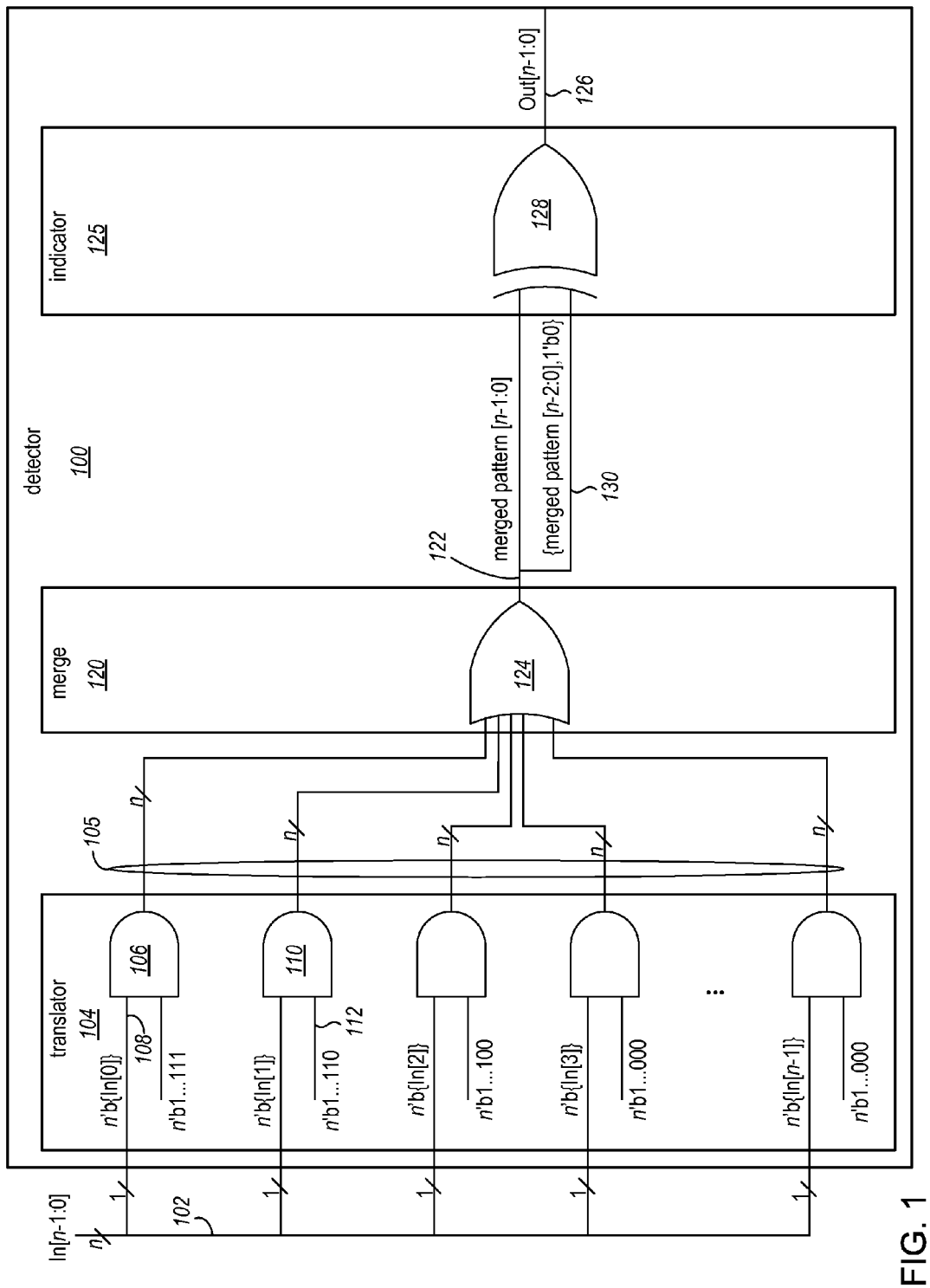
FIG. 1 shows a detector circuit that determines the first bit that is set in an n-bit input word.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed circuits and methods are described in terms of finding the first bit that is set, that is the least significant bit in an input word having a logic 1 value where bits of the input word increase in significance from right to left. It will be appreciated, however, that the disclosed circuits and methods may be adapted to alternative and equivalent implementations, such as those for determining the least significant bit that has a logic 0 value, determining the most significant bit that has a logic 1 value, or determining the most significant bit that has a logic 0 value.

The disclosed detector circuit generally has three stages. In the first stage, a translator circuit translates an n-bit input word into n n-bit patterns. Each of the n-bit patterns corresponds to one bit position of the input word. If the logic value of a bit in the input word is 1, the corresponding n-bit pattern has a logic 1 value for the bit in the same position and a logic 1 value in every bit position to the left of that bit, and a logic 0 value in every bit position to the right of that bit. In other words, the bit pattern has the bit and bits that are more significant assigned logic 1 values, and bits that are less significant assigned logic 0 values. If the logic value of a bit in the input word is 0, then every bit is assigned a logic 0 value in the corresponding n-bit pattern.

In the second stage, the detector circuit combines the n n-bit patterns into one merged n-bit pattern. In the merged n-bit pattern, the bit corresponding to the rightmost/least significant bit input word has a logic 1 value and all bits left/more significant have logic 1 values. All bits less significant have logic 0 values.

The merged n-bit pattern is input to the third stage. In the third stage, an n-bit output pattern is generated. In the bit of the n-bit output pattern that corresponds to the first bit set in the input word, the value is logic 1. All other bits of the output word are logic 0.

FIG. 1 shows a detector circuit 100 that determines the first bit that is set in an n-bit input word. The n bits of the input word 102 are input to the translator circuit 104. The translator circuit includes n n-bit bitwise AND circuits. Each AND circuit generates one of the n n-bit patterns 105, respectively, and each pattern corresponds to one bit position of the n-bit input word. In response to a bit position of the input word having a logic 1 value, the respective AND circuit generates the corresponding pattern having a logic 1 value in a corresponding bit position of the n-bit pattern, a logic 1 value in each bit position left of the corresponding bit position in the n-bit pattern, and a logic 0 value in each bit position right of the corresponding bit position in the n-bit pattern. In response to the one bit position of the input word having a logic 0 value, the respective AND circuit generates the corresponding pattern having a logic 0 value in each bit position of the n-bit pattern.

Each AND circuit has two n-bit input operands. One of the n-bit input operands is n bits all having the same logic value as the corresponding bit of the input word. That is, the first n-bit input operand of logic AND circuit i of the n logic AND circuits, for $0 \leq i \leq n-1$, has n bits having logic values equal to the logic value of bit i of the input word. This is denoted as n'b{In{i}} in FIG. 1, where i is the corresponding bit position in the input word. For example, AND circuit 106 corresponds to bit 0 of the input word 102, and input operand 108 is n bits having logic values the same as the logic value of bit 0 of the input word.

The second n-bit input operand 112 to the AND circuit has a pattern of logic values in which for bit i of the input word 102, the second n-bit input operand has bit i and all bits left of bit i set to logic 1 values, and all bits right of bit i assigned logic 0 values. Specifically, the second n-bit input operand of logic AND circuit i of the n logic AND circuits, for $0 \leq i \leq n-1$, has bit i through bit n-1 equal to logic 1 values and any remaining bits equal to logic 0 values. For example, AND circuit 110 has the second n-bit input of n'b1 ... 110, which indicates an n-bit input having logic 1 values in bits 1 through n-1 and a logic 0 value in bit 0.

The n n-bit patterns output by the AND circuit of the translator circuit 104 are input to the merge circuit 120. The merge circuit combines the n n-bit patterns into one n-bit merged pattern 122. In the merged n-bit pattern, the bit corresponding to the rightmost/least significant bit in the input word is logic value 1 and all bits left/more significant are logic value 1. All bits to the right/less significant are logic value 0. The OR circuit 124 applies a bit-wise OR function to the n n-bit patterns to produce the merged n-bit pattern.

The merged n-bit pattern 122 is input to the indicator circuit 125. The indicator circuit generates an output n-bit pattern 126 having a logic 1 value in one bit position and a logic 0 value in every other bit position. The one bit position in the output n-bit pattern that has a logic 1 value is equal to the rightmost bit position of the input word 102 having a logic 1 value. In an example implementation, the indicator circuit includes an XOR circuit 128. The XOR circuit applies a bit-wise logic XOR function to the merged n-bit pattern 122 and the merged n-bit pattern shifted left by one bit and a logic 0 value shifted in. The shifted merged pattern is shown on input line 130.

Figure 2:
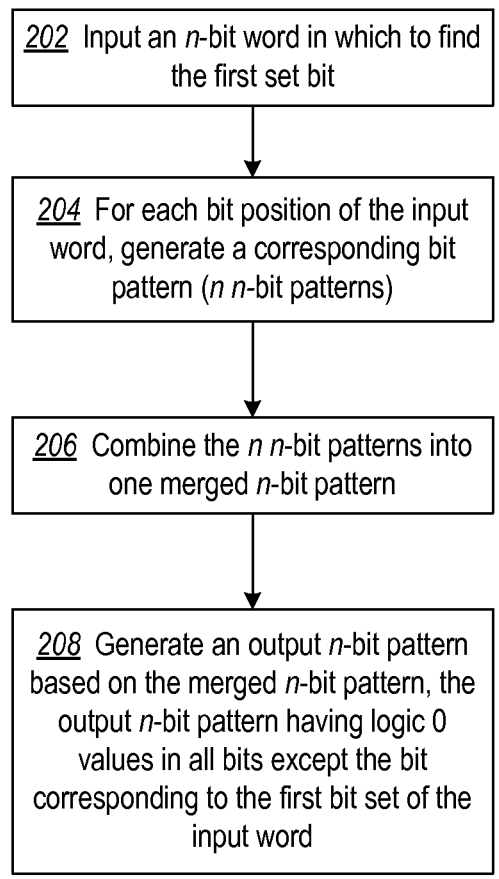
FIG. 2 shows a flowchart of a process of determining the first bit that is set in a multi-bit input word.

FIG. 2 shows a flowchart of a process of determining the first bit that is set in a multi-bit input word. At block 202, an n-bit word is input. From the n-bit word, at block 204 a first logic circuit generates n n-bit patterns in response to the n-bit input word. Each pattern corresponds to one bit position of the n-bit input word. In response to the bit at one bit position of the input word having a logic 1 value, the corresponding pattern has a logic 1 value in a corresponding bit position of the n-bit pattern, a logic 1 value in each bit position left of the corresponding bit position in the n-bit pattern, and a logic 0 value in each bit position right of the corresponding bit position in the n-bit pattern. In response to the bit at one bit position of the n-bit input word having a logic 0 value, the corresponding pattern has a logic 0 value in each bit position of the n-bit pattern.

Each n-bit pattern may be generated by applying a respective bit-wise logic AND function to a first n-bit operand and a second n-bit operand. The first n-bit operand is n bits all having the same logic value as a corresponding bit of the input word. That is, the first n-bit operand of logic AND function i of n logic AND functions, for $0 \leq i \leq n-1$, has n bits having logic values equal to the logic value of bit i of the input word. The second n-bit operand to the AND function has a pattern of logic values in which for bit i of the input word, the second input n-bit input has bit i and all bits left of bit i set to logic 1 values, and all bits right of bit i assigned logic 0 values. Specifically, the second n-bit operand of logic AND circuit i of the n logic AND circuits, for $0 \leq i \leq n-1$, has bit i through bit n-1 equal to logic 1 values and any remaining bits equal to logic 0 values.

At block 206, a second logic circuit combines the n n-bit patterns into one merged n-bit pattern. The n n-bit patterns may be combined into one merged n-bit pattern by applying a bit-wise logic OR function to the n n-bit patterns. In the merged n-bit pattern, the bit corresponding to the rightmost/least significant bit in the input word is logic value 1 and all bits left/more significant are logic 1 values. All bits to the right/less significant are logic 0 values.

At block 208, a third logic circuit generates an output n-bit pattern in response to the merged n-bit pattern. The output n-bit pattern may be generated by applying a bit-wise logic XOR function to the merged n-bit pattern and the merged n-bit pattern shifted left by one bit and a logic 0 value shifted in. The output n-bit pattern has a logic 1 value in one bit position and a logic 0 value in every other bit position, where the one bit position having the logic 1 value is equal to a rightmost bit position of the input word having a logic 1 value.

In some implementations, the detector circuit 100 of FIG. 1 may be implemented on programmable resources of a programmable integrated circuit, such as the programmable resources of a field programmable gate array (FPGA). Though the delay introduced by the detector circuit 100 does not increase to unacceptable levels for large input words, the number of programmable resources used to implement the detector circuit may grow beyond a level that is acceptable for certain applications. For example, for a 128-bit input word, the detector circuit may require 458 look-up tables (LUTs), whereas for a 256-bit input word, the detector circuit may require 1365 LUTs. The circuit arrangement of FIG. 3 cascades instances of the detector circuit to reduce the number of LUTs required for larger input words. For a 256-bit input word and the n-bit detector circuits of FIG. 3 being 16-bit detector circuits, the logic circuit may be implemented using approximately 502 LUTs with only a small increase in delay over a single 256-bit detector circuit.

Figure 3:
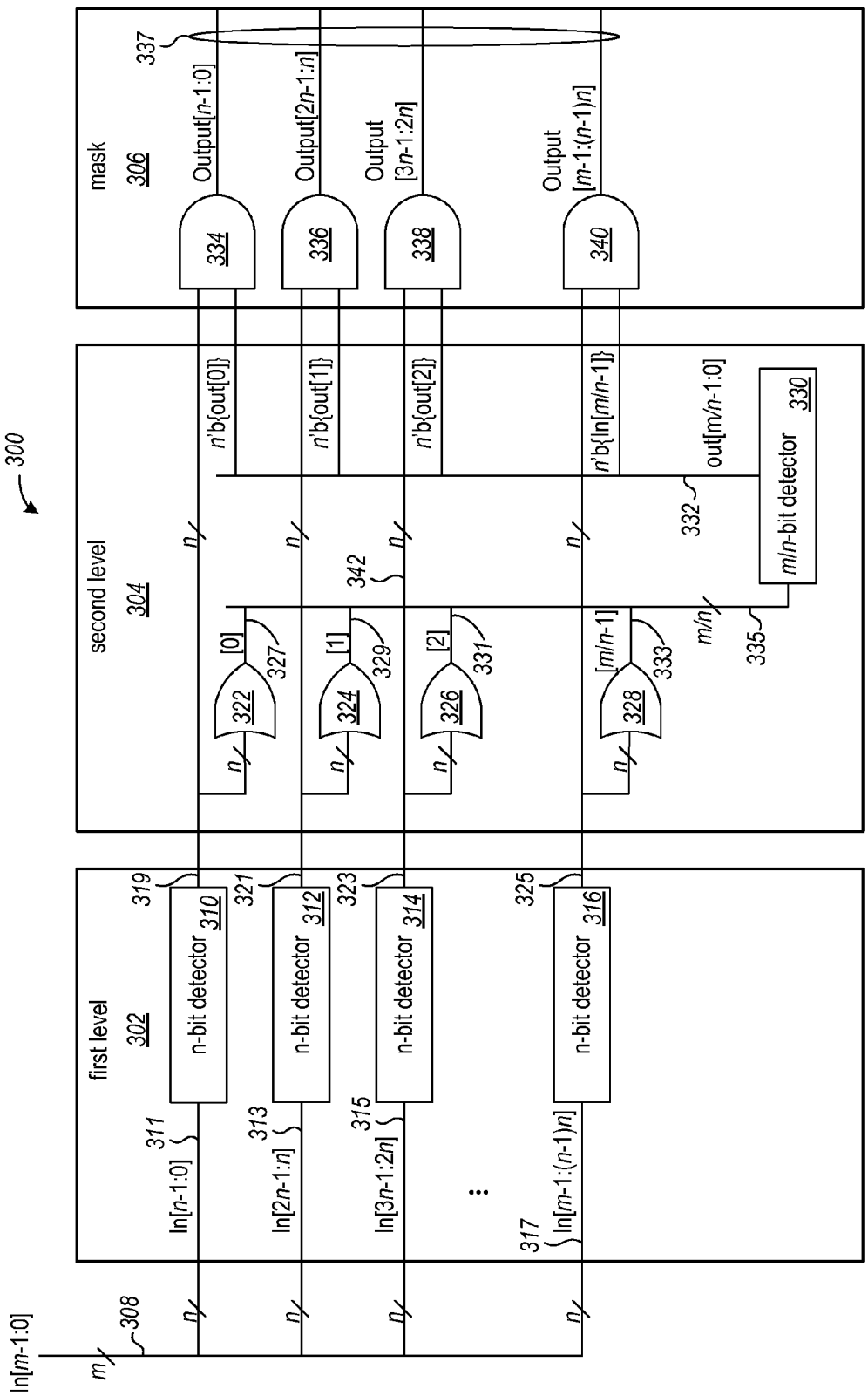
FIG. 3 shows a logic circuit in which multiple instances of the detector circuit of FIG. 1 are used in multiple levels to determine the first bit that is set in an input word having a large number of bits.

FIG. 3 shows a find-first-set logic circuit 300 in which multiple instances of the detector circuit of FIG. 1 are used in multiple levels to determine the first bit that is set in an input word having a large number of bits. The logic circuit 300 includes a first level circuit 302, a second level circuit 304, and a mask circuit 306. For an m-bit input word 308, the first level circuit 302 includes m/n n-bit detector circuits, instances of which are shown as detector circuits 310, 312, 314, and 316. Each of the n-bit detector circuits is an instance of the detector circuit 100 of FIG. 1 and inputs respective n-bit portions 311, 313, 315, and 317 of the input word 308. Detector circuit 310 inputs bits [n−1 . . . 0], detector circuit 312 inputs bits [2n−1 . . . n], detector circuit 314 inputs bits [3n−1 . . . 2n], . . . and detector circuit 316 inputs bits [m−1 . . . (n−1)n]. Each detector circuit generates a respective output n-bit pattern 319, 321, 323, 325 having a logic 1 value in one bit position and a logic 0 value in every other bit position. The one bit position is equal to the rightmost bit position of the respective n-bit portion of the input word having a logic 1 value.

The second level circuit 304 includes a reduction circuit that inputs the output n-bit patterns from the detector circuits of the first level 302. The reduction circuit reduces each output n-bit pattern to a respective output bit 327, 329, 331, 333 having a logic value that indicates whether or not any bit in the respective output n-bit pattern has a logic value 1. In an example implementation, the reduction circuit includes m/n OR circuits, and each OR circuit applies a logic OR function to one of the output n-bit patterns from the first level circuit. The OR circuits are shown as elements 322, 324, 326, and 328.

The second level circuit further includes detector circuit 330, which is an instance of the detector circuit 100 of FIG. 1. The detector circuit 330 inputs the m/n bits output from the OR circuits 322, 324, 326 as an m/n bit input word 335, and 328 and generates an output m/n-bit pattern 332 having a logic 1 value in one bit position and a logic 0 value in every other bit position. The bit position having the logic 1 value is equal to the rightmost bit position in the m/n bits from the OR circuits having a logic 1 value.

Mask circuit 306 is coupled to receive the respective output n-bit patterns from the detector circuits 310, 312, 314, and 316 and to receive the output m/n-bit pattern from the detector circuit 330. The mask circuit generates an output m-bit pattern 337 having a logic 1 value in one bit position and a logic 0 value in every other bit position. The one bit position having the logic 1 value is equal to the rightmost bit position of the m-bit input word 308 having a logic 1 value.

In an example implementation, the mask circuit 306 includes m/n AND circuits, which are shown as elements 334, 336, 338, and 340. Each AND circuit is configured to perform a bit-wise AND operation on two operands. The first operand is the n-bit output pattern from a respective one of the n-bit detector circuits 310, 312, 314, and 316 of the first level circuit 302. The second operand is n-bits having the same logic value as one of the m/n bits in the output pattern 332 from the detector circuit 330. For example, AND circuit 338 inputs the n-bit output pattern 342 from detector circuit 314 and n bits having the logic value of bit [2] of the output pattern 332 from detector circuit 330. Each AND circuit outputs a portion (n bits) of the m output bits. One bit in the m output bits is a logic 1 value, and the position of that bit is the same as the position of the first bit having a logic 1 value in the input word 308.

Figure 4:
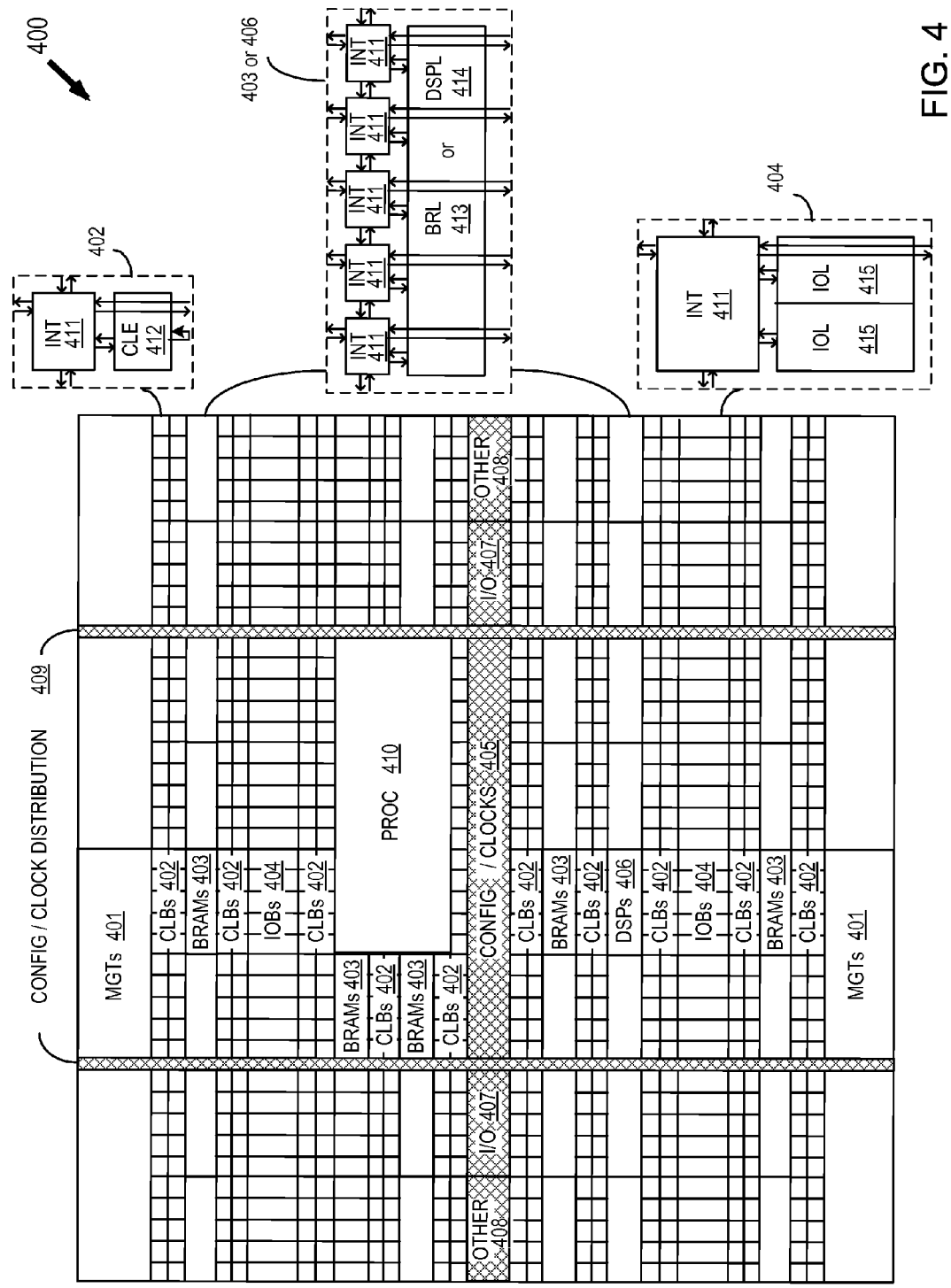
FIG. 4 shows a programmable integrated circuit (IC) on which the disclosed circuits and processes may be implemented.

FIG. 4 shows a programmable integrated circuit (IC) 400 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 4 illustrates programmable IC 400 that includes a large number of different programmable tiles including multi-gigabit transceivers (MGTs) 401, configurable logic blocks (CLBs) 402, random access memory blocks (BRAMs) 403, input/output blocks (IOBs) 404, configuration and clocking logic (CONFIG/CLOCKS) 405, digital signal processing blocks (DSPs) 406, specialized input/output blocks (I/O) 407, for example, clock ports, and other programmable logic 408 such as digital clock managers, analog-to-digital converters, system monitoring logic, and so forth. Some programmable IC having FPGA logic also include dedicated processor blocks (PROC) 410 and internal and external reconfiguration ports (not shown).

In some FPGA logic, each programmable tile includes a programmable interconnect element (INT) 411 having standardized connections to and from a corresponding interconnect element in each adjacent tile. Therefore, the programmable interconnect elements taken together implement the programmable interconnect structure for the illustrated FPGA logic. The programmable interconnect element INT 411 also includes the connections to and from the programmable logic element within the same tile, as shown by the examples included at the top of FIG. 4.

For example, a CLB 402 can include a configurable logic element CLE 412 that can be programmed to implement user logic, plus a single programmable interconnect element INT 411. A BRAM 403 can include a BRAM logic element (BRL) 413 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL) 414 in addition to an appropriate number of programmable interconnect elements. An 10B 404 can include, for example, two instances of an input/output logic element (IOL) 415 in addition to one instance of the programmable interconnect element INT 411. As will be clear to those of skill in the art, the actual I/O bond pads connected, for example, to the I/O logic element 415, are manufactured using metal layered above the various illustrated logic blocks, and typically are not confined to the area of the input/output logic element 415.

In the pictured embodiment, a columnar area near the center of the die (shown shaded in FIG. 4) is used for configuration, clock, and other control logic. Horizontal areas 409 extending from this column are used to distribute the clocks and configuration signals across the breadth of the programmable IC.

Some programmable ICs utilizing the architecture illustrated in FIG. 4 include additional logic blocks that disrupt the regular columnar structure making up a large part of the programmable IC. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for determining the first bit set to a particular logic value in an input word. Other aspects and features will be apparent to those skilled in the art from consideration of the specification. The circuits and methods may be implemented as an application specific integrated circuit (ASIC) or as a logic on a programmable IC. It is intended that the specification and drawings be considered as examples only, with a true scope of the invention being indicated by the following claims.

What is claimed is:

1. A method of finding a first bit that is set in an n-bit input word, comprising:
   generating by a first logic circuit, n n-bit patterns in response to the n-bit input word, each pattern corresponding to one bit position of the n-bit input word;
   wherein in response to the bit at the one bit position of the n-bit input word having a logic 1 value, the corresponding pattern has a logic 1 value in a corresponding bit position of the n-bit pattern, a logic 1 value in each bit position left of the corresponding bit position in the n-bit pattern, and a logic 0 value in each bit position right of the corresponding bit position in the n-bit pattern; and
   wherein in response to the bit at the one bit position of the n-bit input word having a logic 0 value, the corresponding pattern has a logic 0 value in each bit position of the n-bit pattern;
   combining by a second logic circuit, the n n-bit patterns into one merged n-bit pattern; and
   generating by a third logic circuit, an output n-bit pattern in response to the merged n-bit pattern, the output n-bit pattern having a logic 1 value in one bit position and a logic 0 value in every other bit position, the one bit position equal to a rightmost bit position of the n-bit input word having a logic 1 value.

2. The method of claim 1, wherein the combining includes applying a bit-wise logic OR function to the n n-bit patterns to produce the merged n-bit pattern.

3. The method of claim 1, wherein the generating by the third logic circuit includes applying a bit-wise logic XOR function to the merged n-bit pattern and the merged n-bit pattern shifted left by one bit and a logic 0 value shifted in.

4. The method of claim 1, wherein the generating by the first logic circuit includes:
   for each bit of the n-bit input word, applying a bit-wise logic AND function to a respective first n-bit operand and a respective second n-bit operand and generating one of the n-bit patterns;
   wherein the respective first n-bit operand of logic AND circuit i of the n logic AND circuits, for $0 \le i \le n-1$, has n bits having logic values equal to a logic value of bit i of the n-bit input word; and
   wherein the respective second n-bit operand of logic AND circuit i of the n logic AND circuits, for $0 \le i \le n-1$, has bit i through bit n−1 equal to logic value 1 and any remaining bits equal to logic value 0.

5. The method of claim 4, wherein the combining includes applying a bit-wise logic OR function to the n n-bit patterns to produce the merged n-bit pattern.

6. The method of claim 5, wherein the generating by the third logic circuit includes applying a bit-wise logic XOR function to the merged n-bit pattern and the merged n-bit pattern shifted left by one bit and a logic 0 value shifted in.

7. A find-first-set circuit, comprising:
   a translator circuit having an input port coupled to receive an n-bit input word, wherein n>1, and the translator circuit is configured to generate n n-bit patterns, each pattern corresponding to one bit position of the n-bit input word:
   wherein in response to the one bit position of the n-bit input word having a logic 1 value, the translator circuit is configured to generate the corresponding pattern having a logic 1 value in a corresponding bit position of the n-bit pattern, a logic 1 value in each bit position left of the corresponding bit position of the n-bit pattern, and a logic 0 value in each bit position right of the corresponding bit position of the n-bit pattern;
   wherein in response to the one bit position of the n-bit input word having a logic 0 value, the translator circuit is configured to generate the corresponding pattern having a logic 0 value in each bit position of the n-bit pattern;
   a merge circuit coupled to receive the n n-bit patterns and configured to combine the n n-bit patterns into one merged n-bit pattern; and
   an indicator circuit coupled to receive the merged n-bit pattern and configured to generate an output n-bit pattern having a logic 1 value in one bit position and a logic 0 value in every other bit position, the one bit position equal to a rightmost bit position of the n-bit input word having a logic 1 value.

8. The find-first-set circuit of claim 7, wherein the merge circuit is configured to apply a bit-wise logic OR function to the n n-bit patterns to produce the merged n-bit pattern.

9. The find-first-set circuit of claim 7, wherein the indicator circuit is further configured to apply a bit-wise logic XOR function to the merged n-bit pattern and the merged n-bit pattern shifted left by one bit and a logic 0 value shifted in.

10. The find-first-set circuit of claim 7, wherein:
the translator circuit includes n logic AND circuits, each logic AND circuit corresponding to one bit of the n-bit input word and configured to apply a bit-wise logic AND function to a respective first n-bit operand and a respective second n-bit operand and generate one of the n-bit patterns;
the respective first n-bit operand of logic AND circuit i of the n logic AND circuits, for $0 \leq i \leq n-1$, has n bits having logic values equal to a logic value of bit i of the n-bit input word; and
the respective second n-bit operand of logic AND circuit i of the n logic AND circuits, for $0 \leq i \leq n-1$, has bit i through bit n−1 equal to logic value 1 and any remaining bits equal to logic value 0.

11. The find-first-set circuit of claim 10, wherein the merge circuit is configured to apply a bit-wise logic OR function to the n n-bit patterns to produce the merged n-bit pattern.

12. The find-first-set circuit of claim 11, wherein the indicator circuit is configured to apply a bit-wise logic XOR function to the merged n-bit pattern and the merged n-bit pattern shifted left by one bit and a logic 0 value shifted in.

13. The find-first-set circuit of claim 7, wherein the translator circuit, merge circuit, and indicator circuit are implemented in programmable logic.

14. A find-first-set circuit, comprising:
a plurality of first detector circuits;
wherein each first detector circuit is configured to receive respective first n-bit input words, wherein n>1 and each respective first n-bit input word is a portion of an m-bit input word;
wherein each first detector circuit is further configured to generate a respective first output n-bit pattern having a logic 1 value in one bit position and a logic 0 value in every other bit position, the one bit position equal to a rightmost bit position of the respective first n-bit input word having a logic 1 value;
a reduction circuit coupled to receive the respective first output n-bit patterns;
wherein the reduction circuit is configured to reduce each respective first output n-bit pattern to a respective output bit having a logic value that indicates whether or not any bit of the respective first output n-bit pattern has a logic value 1;
a second detector circuit coupled to receive the respective output bits from the reduction circuit as an m/n-bit input word;
wherein the second detector circuit is configured to generate an output m/n-bit pattern having a logic 1 value in one bit position and a logic 0 value in every other bit position, the one bit position equal to a rightmost bit position of the m/n-bit input word having a logic 1 value; and
a mask circuit coupled to receive the respective first output n-bit patterns and the output m/n-bit pattern;
wherein the mask circuit is configured to generate an output m-bit pattern having a logic 1 value in one bit position and a logic 0 value in every other bit position, the one bit position equal to a rightmost bit position of the m-bit input word having a logic 1 value.

15. The find-first-set circuit of claim 14, wherein each first detector circuit includes:
a translator circuit having an input port coupled to receive the n-bit input word, wherein n>1, and the translator circuit is configured to generate n n-bit patterns, each pattern corresponding to one bit position of the n-bit input word;
wherein in response to the bit at the one bit position of the n-bit input word having a logic 1 value, the translator circuit is configured to generate the corresponding pattern having a logic 1 value in a corresponding bit position of the n-bit pattern, a logic 1 value in each bit position left of the corresponding bit position in the n-bit pattern, and a logic 0 value in each bit position right of the corresponding bit position in the n-bit pattern;
wherein in response to the bit at the one bit position of the n-bit input word having a logic 0 value, the translator circuit is configured to generate the corresponding pattern having a logic 0 value in each bit position of the n-bit pattern;
a merge circuit coupled to receive the n n-bit patterns;
wherein the merge circuit is configured to combine the n n-bit patterns into one merged n-bit pattern; and
an indicator circuit coupled to receive the merged n-bit pattern;
wherein the indicator circuit is configured to generate an output n-bit pattern having a logic 1 value in one bit position and a logic 0 value in every other bit position, the one bit position equal to a rightmost bit position of the n-bit input word having a logic 1 value.

16. The find-first-set circuit of claim 15, wherein the merge circuit is configured to apply a bit-wise logic OR function to the n n-bit patterns to produce the merged n-bit pattern.

17. The find-first-set circuit of claim 15, wherein the indicator circuit is configured to apply a bit-wise logic XOR function to the merged n-bit pattern and the merged n-bit pattern shifted left by one bit and a logic 0 value shifted in.

18. The find-first-set circuit of claim 15, wherein:
the translator circuit includes n logic AND circuits, each logic AND circuit corresponding to one bit of the n-bit input word and configured to apply a bit-wise logic AND function to a respective first n-bit operand and a respective second n-bit operand and generate one of the n-bit patterns;
the respective first n-bit operand of logic AND circuit i of the n logic AND circuits, for $0 \leq i \leq n-1$, has n bits having logic values equal to a logic value of bit i of the n-bit input word; and
the respective second n-bit operand of logic AND circuit i of the n logic AND circuits, for $0 \leq i \leq n-1$, has bit i through bit n−1 equal to logic value 1 and any remaining bits equal to logic value 0.

19. The find-first-set circuit of claim 18, wherein the merge circuit is configured to apply a bit-wise logic OR function to the n n-bit patterns to produce the merged n-bit pattern.

20. The find-first-set circuit of claim 19, wherein the indicator circuit is configured to apply a bit-wise logic XOR function to the merged n-bit pattern and the merged n-bit pattern shifted left by one bit and a logic 0 value shifted in.

* * * * *